US005635865A

United States Patent [19]

Moon et al.

[11] Patent Number: 5,635,865

[45] Date of Patent: Jun. 3, 1997

[54] POWER DRIVING CIRCUIT OF A THIN FILM TRANSISTOR LIQUID CRYSTAL DISPLAY

[75] Inventors: Seung-Hwan Moon, Seoul; Kyoung-Hoon Shin, Suwon, both of Rep. of Korea

[73] Assignee: Samsung Electronics Co., Ltd., Suwon, Rep. of Korea

[21] Appl. No.: 474,089

[22] Filed: Jun. 7, 1995

[30] Foreign Application Priority Data

Jun. 7, 1994 [KR] Rep. of Korea ...................... 94-12723

[51] Int. Cl.$^6$ ................................ G09G 3/36; H03K 3/01

[52] U.S. Cl. .......................... 327/108; 327/483; 327/403; 327/415; 327/416; 327/530; 327/544; 327/567; 345/211; 345/98

[58] Field of Search .................................... 327/427, 483, 327/544, 530, 108, 109, 575, 403, 404, 415, 416, 567; 345/87, 92, 211, 212

[56] References Cited

U.S. PATENT DOCUMENTS

| | | | |
|---|---|---|---|
| 5,243,333 | 9/1993 | Shiba et al. | 345/100 |
| 5,283,565 | 2/1994 | Suzuki et al. | 345/98 |

*Primary Examiner*—Timothy P. Callahan
*Assistant Examiner*—Dinh T. Le
*Attorney, Agent, or Firm*—Cushman Darby & Cushman, IP Group of Pillsbury Madison & Sutro L.L.P.

[57] ABSTRACT

A power driving circuit of a thin film transistor liquid crystal display includes Darlington circuits for generating voltages corresponding to the gate driving voltages required in the displays. Analog switching circuits control the application of voltages used to form the Von and Voff driving waveforms, which have driving voltage levels generated from the Darlington circuits. The phasing of the driving waveforms is controlled by a phasing signal which is received by the analog switching circuits. The power driving circuit of the present invention consumes less power than conventional driving circuits.

9 Claims, 3 Drawing Sheets

POWER DRIVING CIRCUIT OF A THIN FILM TRANSISTOR LIQUID CRYSTAL DISPLAY

BACKGROUND OF THE INVENTION

The present invention relates to a power driving circuit of a thin film transistor liquid crystal display (TFT-LCD), which, more specifically, reduces consumption of power by generating the output voltage, with a Darlington circuit rather than an operational amplifier.

DESCRIPTION OF THE PRIOR ART

There have been generally known two methods of providing a thin film transistor liquid crystal display: one is a common electrode constant driving method, another is a common electrode reverse driving method.

The common electrode reverse driving method can reduce the extension of grey voltage to half that of the common electrode constant driving method, thereby enabling use of an integrated driver circuit having a small size and low price, obtained from a complementary metal oxide semiconductor making process.

The common electrode reverse driving method has been proposed in JAPAN DISPLAY'92, pp. 475–478, "An 8.4-in TFT-LCD system for a note size computer using 3-bit digital data drivers" and in NIKKEL MICRODEVICES, August 1993, pp. 64–65, TOSHIBA and HITACHI SEISAKUSHO et al, "5 V driving method for low consumption power of TFT color liquid crystal".

In such a method, the electric potential of the grey voltage applied to the liquid crystal, and that of common electrode voltage, vibrate in a predetermined amplitude as cited in the above-mentioned papers. That method has an advantage in that it can reduce consumption of power required for driving the circuit, by driving the liquid crystal with a low voltage, whereas it has a disadvantage in that the construction of the driving circuit is difficult, because of the complicated driving method.

For driving a thin film transistor liquid crystal display using the common electrode reverse driving method, power driving signals having the waveform illustrated in FIGS. 1A–1C are required. Von, shown in FIG. 1A, is the input waveform to a gate driver, which causes the thin film transistor to be turned ON periodically; Voff, shown in FIG. 1C, is the input waveform to a gate driver, which causes all transistors of the thin film transistor to be turned OFF, and Vcom, shown in FIG. 1B, is the input waveform to a common electrode of a liquid crystal capacitor. (Von, Voff and Vcom are also indicated in FIG. 2.)

Conventionally, to make such a waveform, there has been used a typical power driving circuit including two analog switches 1 and 2, three operational amplifiers OP1 to OP3 operated with a voltage follower, and three push-pull amplifiers P1 to P3 as shown in FIG. 2.

The conventional power driving circuit is described in more detail below with reference to FIG. 2.

A RVS signal (inversed signal) is a timing signal for phasing Von, Voff, and Vcom, which are input to a thin film transistor liquid crystal display, whereas RVSB signal is an antiphase signal to the RVS signal. RVS and RVSB signals are output from a timing controller.

A first analog switching circuit 1 is composed of an analog switch AS1, to which a pair of variable resistances VR11 and VR12 and a pair of resistances R11 and R12 are connected. A second analog switching circuit 2 is composed of an analog switch AS2, to which four variable resistances VR21 to VR24 and four resistances R21 and R24 are connected. The analog switching circuits 1 and 2 are turned on when the RVS signal which controls the switch is high, and is turned off when the RVS signal is low.

The operational amplifiers OP1 to OP3, operated by a voltage follower, apply the voltage level which is input to a non-inverting terminal to a base terminal of the push-pull amplifiers P1 to P3, regardless of the load condition of the push-pull amplifiers P1 to P3.

In such an operation, power is expressed as follows:

$$V_{GG}(+25\ V)>V_{CC}(+8\ V)>V_{DD}(+5\ V)>GND(0\ V)>V_{EE}(-8\ V),$$

where the numbers in the parentheses are typical potentials.

The following describes the steps of generating the waveform Von.

When the RVS signal is high, the RVSB signal is low. At this time, the analog switch AS1 outputs the voltage set up by the variable resistance VR2, which is input to the base terminal of the push-pull amplifier P1 through the operational amplifier OP1. The input voltage falls as much as the voltage $V_{BE}$, which amounts to the voltage level $V_{ghl}$.

Differently from the above, when the RVS signal is low, the RVSB signal is high. At this time, the analog switch AS1 outputs the voltage set up by the variable resistance VR11, which is input to the base terminal of the push-pull amplifier P1, through the operational amplifier OP1, as in the above-mentioned case. Then, the push-pull amplifier P1 outputs the voltage $V_{gh2}$ which is lowered as much as $V_{BE}$.

Waveform Vcom is obtained by the same method. In this case, the level $V_{cl}$ is adjusted by the variable resistance VR22, while the level $V_{c2}$ is adjusted by VR21. In waveform Voff, the level $V_{gL1}$ is adjusted by the variable resistance VR24, while the level $V_{gL2}$ is adjusted by the variable resistance VR23.

However, there are two disadvatages when constructing a power driving circuit as above: First, power consumption is considerably large. This is why, as cited in the above papers of TOSHIBA and HITACHI SEISAKUSHO, power consumption to the circuit has increased when generating the power driving waveform by the operational amplifier. Second, the power voltage level cannot be output, because the voltage is lowered by the off-set voltage of the operational amplifier and the applied voltage to the base-emitter of the push-pull amplifier. In other words, although it is desirable that the level $V_{gL2}$ be the same as voltage $V_{EE}$, the circuit of the conventional art outputs the attenuated voltage as much as the off-set voltage of the operational amplifier and the applied voltage to base-emitter of the push-pull amplifier.

Whereas ideally waveform Vcom is a swing between the ground potential GND and the voltage $V_{DD}$, this waveform requires and thus leads to increased power consumption.

SUMMARY OF THE INVENTION

In view of the above, it is an object of the present invention to provide a circuit for driving a thin film transistor liquid crystal display (TFT-LCD) with minimal power consumption and having an off-set voltage.

To achieve this object, according to a preferred embodiment of the present invention, a circuit is provided which comprises: analog switching circuits including a first analog switching circuit for turning ON or OFF a first power signal and a second analog switching circuit for turning ON or OFF a second power signal applied from an inverse signal corresponding to each level of an inverse signal and a non-inverse signal; a first Darlington circuit for generating low level of waveform Von by turning OFF said first analog switching circuit; a second Darlington circuit for generating a high level of waveform Voff by turning ON said second analog switching circuit; a first switching circuit for outputting a high level of waveform Von by the first power signal turned ON when the inverse signal is at a high level, and for outputting a low level of waveform Von from the first Darlington circuit when said inverse signal is at a low level; a second switching circuit for outputting a low level of waveform Voff by the second power signal turned ON when the inverse signal is at a low level, and for outputting a high level of waveform Voff from the second Darlington circuit when said inverse signal is at a high level; and a third switching circuit for outputting a ground voltage when said inverse signal is at a low level, and for outputting a given power voltage level when said inverse signal is at a high level.

DETAILED DESCRIPTION OF THE PREFERRED EMBODIMENTS

A preferred embodiment of the present invention is described with reference to FIG. 3 of the accompanying drawings.

Figure 3:
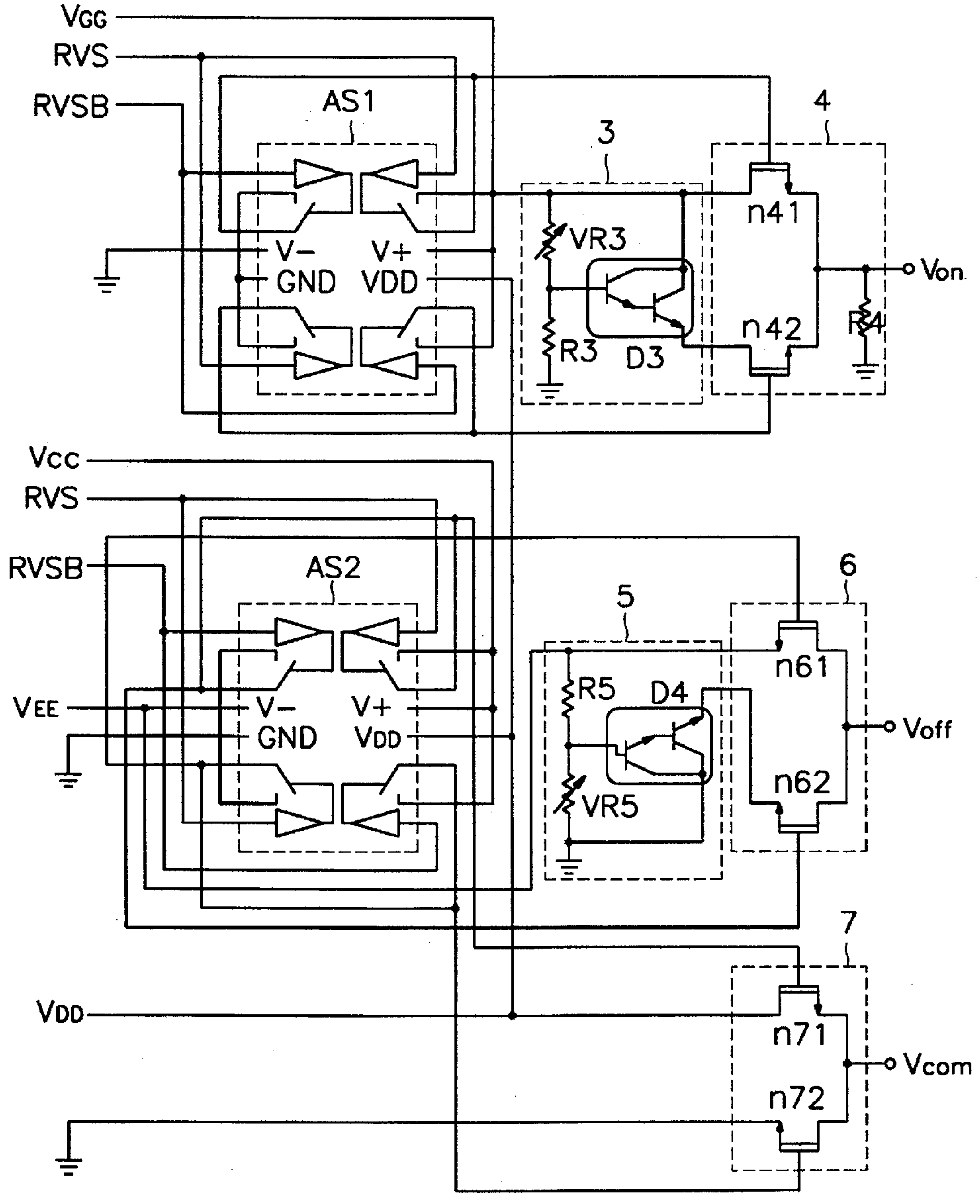
FIG. 3 is a detailed circuit diagram of a power driving circuit for driving a thin film transistor liquid crystal display in accordance with a preferred embodiment of the present invention.

As shown in FIG. 3, a circuit for forming waveforms such as Von, Voff, and Vcom comprises analog switching circuits including a first analog switching circuit AS1 and a second analog switching circuit AS2 which are analog multiplexers, Darlington circuits 3 and 5 of which each input terminal is connected to each output terminal of the analog switches AS1 and AS2, and first, second and third switching circuits 4, 6 and 7, of which each input terminal is connected to each output terminal of the analog switches AS1 and AS2 and the Darlington circuit 3 and 5. The first, second and third switching circuits each include a respective pair of N-MOS transistors. Further, it is possible that the first, second and third switching circuits each include a respective pair of P-MOS transistors.

Figure 1A:
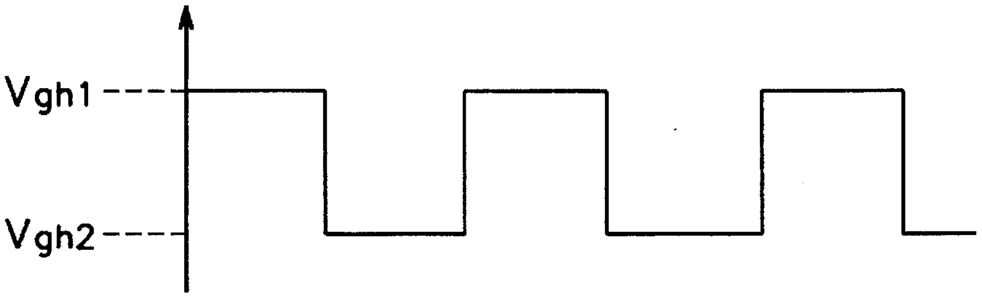
FIG. 1A (Prior Art)
FIGS. 1A–1C are a conventional waveform diagrams of a power driving signal for driving a thin film transistor liquid crystal display.
Figure 1B:
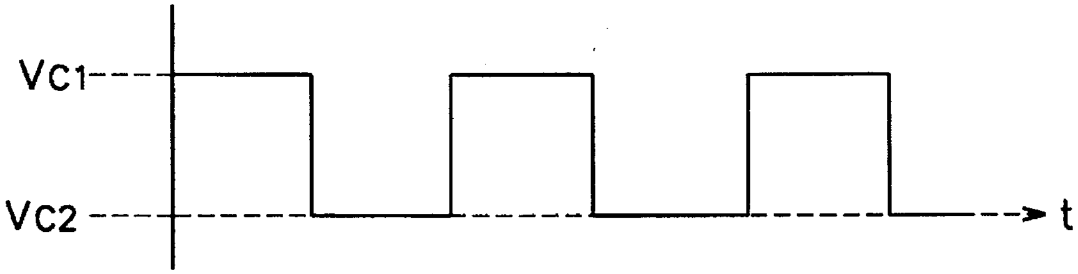
FIG. 1B (Prior Art)
Figure 1C:
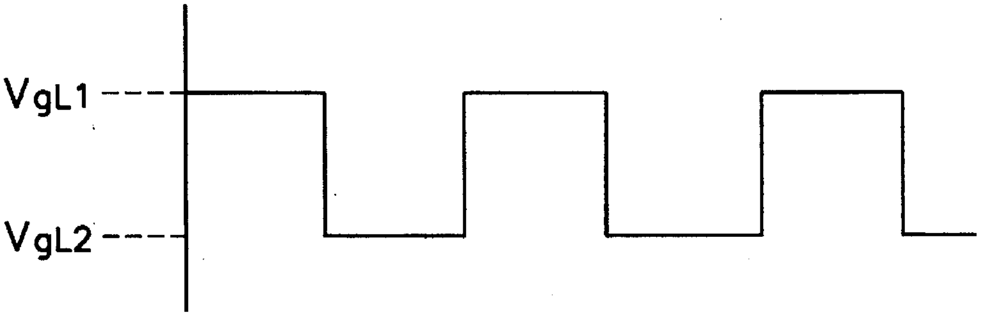
FIG. 1C (Prior Art)
Figure 2:
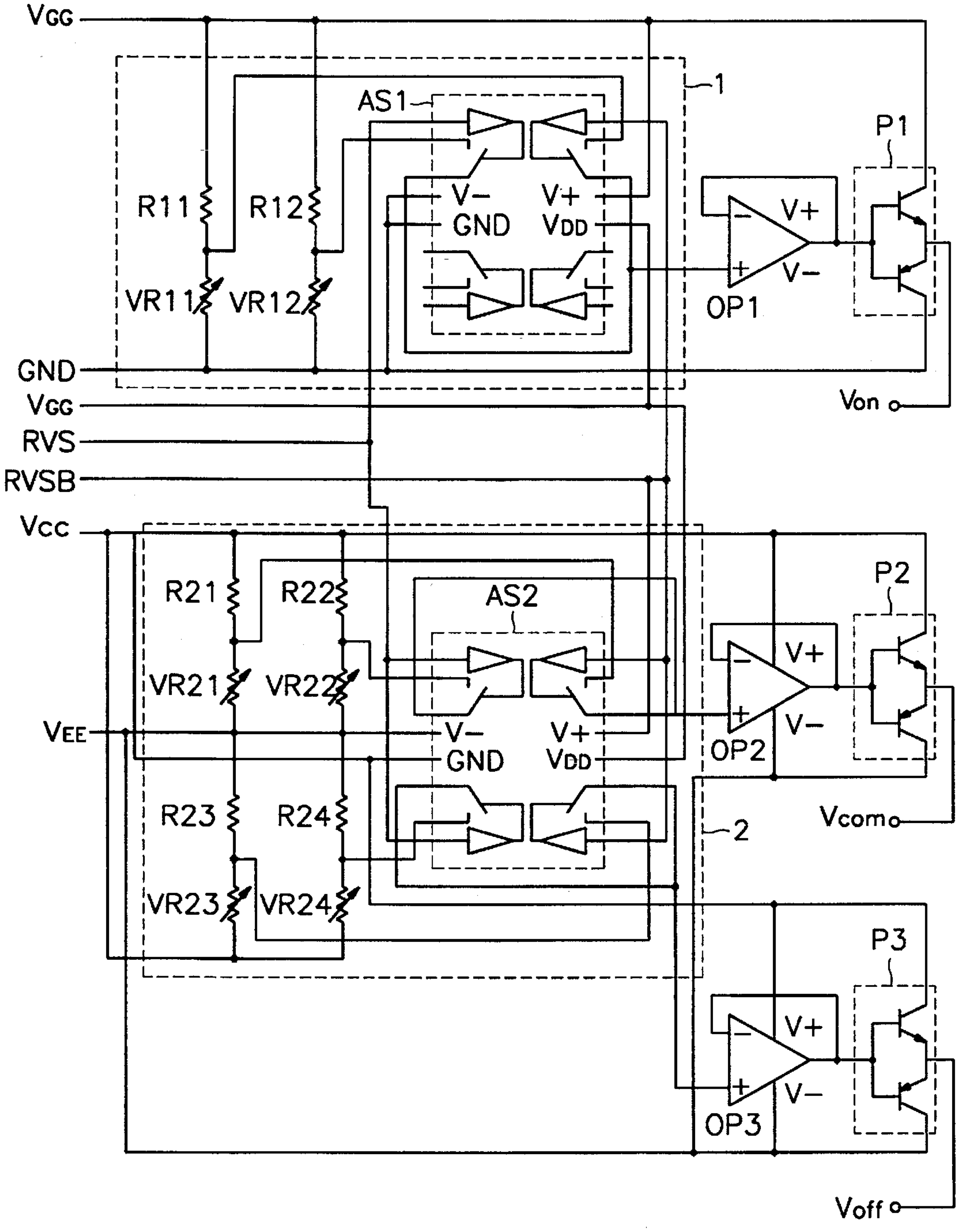
FIG.2 (Prior Art)
FIG. 2 is a detailed circuit diagram of a power driving circuit for driving a thin film transistor liquid crystal display in accordance with the prior art.

In the conventional circuit of FIG. 2, an analog switch is used for outputting a voltage level which determines the level of the output voltage, while in the circit of the present invention the analog switch is used for outputting the electric potential which makes the N-MOS transistors turn ON or OFF.

It should be noted that each pair of N-MOS transistors n41 and n42, n61 and n62, and n71 and n72, which are turned ON or OFF by the output from the analog switches AS1 and AS2, can be replaced with a P-MOS transistor.

The Darlington circuits 3 and 5 including Darlington transistors D3 and D4 and adjustment resistances VR3 and VR5, respectively, are characterized by the way they output the levels $V_{gh2}$ and $V_{gL1}$ through N-MOS transistors n42 and n62. That is, the first and second Darlington circuits each include a variable resistor for adjusting the voltage of the first or second power signal by voltage dropping, and a Darlington transistor for dropping the voltage as much as its base-emitter voltage from the adjusted voltage, and for outputting the dropped voltage to the correspoding switching circuit.

Next, there is described a method for forming waveform Von.

The analog switch AS1 is turned ON when the RVS signal is high, while it is turned OFF when the RVS signal is low. Accordingly, provided that the RVS signal in a high state is output, the power signal VGG is applied to a gate of the N-MOS transistor n41, whereby Von becomes $V_{GG}$-Vth. Simultaneously, a ground level voltage is applied to a gate of the N-MOS transistor n42, whereby the N-MOS transistor n42 is turned OFF.

Provided that the RVSB signal in a high state is output, $V_{GG}$ is applied to a gate of the N-MOS transistor n42, which is turned ON subsequently, and level $V_{gh2}$, determined by adjustment resistance VR3, is output. At this time, ground level is applied to the gate of the N-MOS transistor n41, and the N-MOS transistor n41 is turned off. As a result, in case that the RVS signal is high or low, $V_{gh1}$ or $V_{gh2}$ is output, respectively, through the output terminal for waveform Von.

The method for forming the waveform Voff is described below.

When the RVS signal is high, the analog switch AS2 applies the power signal Vcc to the gate of the N-MOS transistor n62 to be turned ON, and the potential $V_{gL1}$, decreased as much as 2 $V_{BE}$ at $V_B$, adjusted by variable resistance VR5, is output to the source end of the N-MOS transistor n62. In that event, the N-MOS transistor n61 is turned OFF by applying $V_{EE}$ to the gate of the N-MOS transistor n61.

Also, the power voltage level is applied to the gate of the N-MOS transistor n62, whereby the N-MOS transistor n62 is turned OFF. As a result, in case that RVS signal is high or low, $V_{gh1}$ or $V_{gh2}$ is output respectively through the output terminal for the waveform Voff.

The method of forming the waveform Vcom is described next.

The gate terminals of the N-MOS transistors n61 and n62 are connected to those of the N-MOS transistors n72 and n71, respectively. From this, the N-MOS transistor n72 is turned ON when the N-MOS transistor n61 is turned ON, and zero potential level (GND) is output through the output terminal for waveform Vcom.

Simultaneously, the N-MOS transistor n71 is turned ON when the N-MOS transistor n62 is turned ON, so that power voltage level $V_{DD}$ is output through the output terminal for waveform Vcom. That is, when the RVS signal is high or low, $V_{C1}(V_{DD})$ or $V_{C2}$(GND) is output, respectively.

As described above, the embodiment of the present invention consumes about 0.5 W less power than the prior art. Further, according to the present invention, the voltage level $V_{gL2}$ can be replaced with the power voltage level $V_{EE}$, so that the thin film transistor receives the voltage of the waveform Voff sufficiently. From this, it is possible to obtain a circuit for driving a thin film transistor liquid crystal display capable of improving the quality of picture in a liquid crystal display.

What is claimed is:

1. A power driving circuit of a thin film transistor liquid crystal display comprising:

a first analog switching circuit and a second analog switching circuit, said first and second analog circuits both having means for receiving a phasing signal having a first state and a second state opposite said first state, said first analog switching circuit outputting a first control signals in response to said first state of said phasing signal, and said second analog switching circuit outputting a second control signal in response to said second state of said phasing signal;

a first Darlington circuit which generates a first voltage having a first voltage level;

a second Darlington circuit which generates a second voltage having a second voltage level;

a first switching circuit which receives said first voltage level from said first Darlington circuit and which receives a third voltage having a third voltage level greater than said first voltage level from first power source, said first switching circuit being coupled to receive said first control signal from said first analog switching circuit and outputting a first power waveform having a high level corresponding to said third voltage level in response to said first control signal, and otherwise having a low level corresponding to said first voltage level;

a second switching circuit which receives said second voltage level from said second Darlington circuit and which receives a fourth voltage having a fourth voltage level less than said second voltage level from a second power source, said second switching circuit being coupled to receive said second control signal from said second analog switching circuit and outputting a second power waveform having a high level corresponding to said second voltage level in response to said second control signal, and otherwise having a low level corresponding to said fourth voltage level; and a third switching circuit which receives a ground voltage having a ground voltage level and which receives a fifth voltage having a fifth voltage level from a third power source, said third switching circuit being coupled to receive said second control signal from said second analog switching circuit and outputting a third power waveform having a high level corresponding to said fifth voltage level in response to said second control signal and otherwise having a low level corresponding to said ground voltage level.

2. A power driving circuit of a thin film transistor liquid crystal display according to claim 1, wherein said first analog switching circuit and said second analog switching circuit are analog multiplexers.

3. A power driving circuit of a thin film transistor liquid crystal display according to claim 1, wherein said first, second and third switching circuits each includes a respective pair of N-MOS transistors.

4. A power driving circuit of a thin film transistor liquid crystal display according to claim 1, wherein said first, second and third switching circuits each includes a respective pair of P-MOS transistors.

5. A power driving circuit of a thin film transistor liquid crystal display according to claim 1, wherein said first and second Darlington circuits each includes a variable resistor coupled to a Darlington transistor.

6. A power driving circuit according to claim 1, wherein said first and second power waveforms are gate driving signals and said third power waveform is a common electrode signal, and wherein said first and second voltage levels correspond to gate voltages required to drive thin film transistors of said thin film liquid crystal display on and off, respectively.

7. A power driving circuit of a thin film transistor liquid crystal display comprising:

a first Darlington circuit which generates a first voltage having a first voltage level;

a second Darlington circuit which generates a second voltage having a second voltage level, said first and second voltage levels corresponding to gate driving voltages required to drive thin film transistors of said thin film transistor liquid crystal display on and off, respectively;

first means for receiving a phasing signal and for outputting a first control signal in correspondence with said phasing signal;

second means for receiving said phasing signal and for outputting a second control signal in correspondence with said phasing signal;

a first waveform generating circuit coupled to said first Darlington circuit and coupled to receive said first control signal from said first means and a third voltage having a third voltage level greater than said first voltage level from a first power source, said first waveform generating circuit outputting a first power waveform having high and low levels in correspondence with said first control signal, said high level corresponding to said third voltage level and said low level corresponding to said first voltage level; and a second waveform generating circuit coupled to said second Darlington circuit and coupled to receive said second control signal from said second means and a fourth voltage having a fourth voltage level less than said second voltage level from a second power source, said second waveform generating circuit outputting a second power waveform having high and low levels in correspondence with said second control signal, said high level corresponding to said second voltage level and said low level corresponding to said fourth voltage level.

8. A power driving circuit according to claim 7, further comprising:

a third waveform generating circuit which is coupled to receive said second control signal from said second means, a fourth voltage having a fourth voltage level corresponding to a level required to drive a common electrode of said thin film transistor liquid crystal display from a third power source, and a ground voltage having a ground voltage level, said third waveform generating circuit outputting a third power waveform having high and low levels in correspondence with said second control signal, said high level corresponding to said fourth voltage level and said low level corresponding to said ground voltage level.

9. A power driving circuit according to claim 8, wherein said first, second and third waveforms are used to drive said thin film transistor liquid crystal display according to a common electrode reverse driving method.

* * * * *